US008710683B2

(12) United States Patent
Kim (10) Patent No.: US 8,710,683 B2
(45) Date of Patent: Apr. 29, 2014

(54) METHOD OF FORMING WAFER LEVEL MOLD USING GLASS FIBER AND WAFER STRUCTURE FORMED BY THE SAME

(75) Inventor: Tae Hwan Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 105 days.

(21) Appl. No.: 13/222,444

(22) Filed: Aug. 31, 2011

(65) Prior Publication Data

US 2012/0074599 A1    Mar. 29, 2012

(30) Foreign Application Priority Data

Sep. 29, 2010    (KR) .................... 10-2010-0094275

(51) Int. Cl.
*H01L 29/02*    (2006.01)

(52) U.S. Cl.
USPC ............................ 257/793; 438/127; 438/464

(58) Field of Classification Search
USPC ................................................. 438/127, 464
See application file for complete search history.

(56) References Cited

U.S. PATENT DOCUMENTS

| 7,642,128 B1 * | 1/2010 | Lin et al. ....................... 438/106 |
| 7,645,514 B2 * | 1/2010 | Watanabe et al. ............. 428/416 |
| 2001/0029666 A1 * | 10/2001 | Nakamura et al. ............... 29/846 |
| 2005/0085034 A1 * | 4/2005 | Akiba et al. ................... 438/232 |
| 2006/0154078 A1 * | 7/2006 | Watanabe et al. ............. 428/413 |
| 2008/0224940 A1 * | 9/2008 | Sugiyama et al. ............. 343/873 |
| 2008/0241296 A1 * | 10/2008 | Wang et al. ..................... 425/130 |
| 2008/0311706 A1 * | 12/2008 | Dozen et al. ................... 438/127 |
| 2009/0079089 A1 * | 3/2009 | Brunnbauer et al. ......... 257/777 |
| 2009/0079090 A1 * | 3/2009 | Pressel et al. ................. 257/777 |
| 2009/0140442 A1 * | 6/2009 | Lin ................ 257/778 |
| 2010/0148360 A1 * | 6/2010 | Lin et al. ....................... 257/737 |
| 2010/0248452 A1 * | 9/2010 | Saito et al. .................... 438/464 |
| 2011/0156232 A1 * | 6/2011 | Youn et al. .................... 257/686 |
| 2012/0119373 A1 * | 5/2012 | Hunt ............................. 257/774 |
| 2013/0200528 A1 * | 8/2013 | Lin et al. ....................... 257/774 |

FOREIGN PATENT DOCUMENTS

| JP | 2008262547 A | 10/2008 |
| JP | 2008270762 A | 11/2008 |
| KR | 20080087693 A | 10/2008 |
| KR | 20090057888 A | 6/2009 |

* cited by examiner

*Primary Examiner* — Julio J Maldonado
*Assistant Examiner* — Jaehwan Oh
(74) *Attorney, Agent, or Firm* — Harness, Dickey & Pierce, P.L.C.

(57) ABSTRACT

According to example embodiments, a wafer level mold may be formed by a method including attaching a substrate to a lower side of a wafer on which a semiconductor chip is arranged, applying molding liquid to an upper and at least one lateral side of the semiconductor chip and an upper side of the wafer where the semiconductor chip is not arranged, loading a fiber onto the applied liquid, forming a mold layer by compression-molding and curing the liquid loaded with the fiber, and separating the substrate from the wafer.

17 Claims, 7 Drawing Sheets

METHOD OF FORMING WAFER LEVEL MOLD USING GLASS FIBER AND WAFER STRUCTURE FORMED BY THE SAME

CROSS-REFERENCE TO RELATED APPLICATIONS

This application claims priority under 35 U.S.C. §119 to the benefit of Korean Patent Application No. 10-2010-0094275, filed on Sep. 29, 2010, in the Korean Intellectual Property Office, the entire contents of which is incorporated herein by reference.

BACKGROUND

1. Field

Example embodiments of inventive concepts relate to a method of forming a wafer level mold and/or a wafer structure formed by the same, and more particularly, to a method of forming a wafer level mold using fiber, which reduces warpage due to a cure of the mold, and a wafer structure formed by the same.

2. Description of the Related Art

A wafer level mold refers to a process or structure for protecting a semiconductor chip from being damaged by external factors after mounting the semiconductor chip on a semiconductor wafer. A plurality of semiconductor chips may be manufactured on a wafer level, and then separated into individual semiconductor chips. The individual semiconductor chips may be applied to a lead frame, a printed circuit board (PCB), a circuit film, etc.

When forming a wafer level mold, it is desirable to limit the amount of warpage in the structure including the mold and the underlying wafer including a plurality of semiconductor chips. Warpage may cause cracks, defects, and/or separation, for example separation occurring when individual semiconductor chips are applied to a PCB.

SUMMARY

Example embodiments of inventive concepts relate to a method of forming a wafer level mold and a wafer structure formed by the same.

According to example embodiments of inventive concepts, a method of forming a wafer level mold includes: attaching a substrate to a lower side of a wafer on which a semiconductor chip is arranged, applying a molding liquid to an upper and at least one lateral side of the semiconductor chip and an upper side of the wafer where the semiconductor chip is not arranged, loading a fiber onto the applied liquid, forming a mold layer by compression-molding and curing the liquid loaded with the fiber, and separating the substrate from the wafer.

The fiber may include a glass fiber. The glass fiber may include one of a chopped strand, cotton yarn, a woven stuff, a knitwork, a nonwoven sheet, and combinations thereof.

According to example embodiments of inventive concepts, a method of forming a wafer level mold includes: attaching a substrate to a lower side of a wafer on which a semiconductor chip is arranged, loading a prepreg impregnated with a molding liquid onto an upper side of the semiconductor chip and an upper side of the wafer where the semiconductor chip is not arranged, forming a mold layer by compression-molding and curing the loaded prepreg; and separating the substrate from the wafer.

The wafer may include a through-silicon via (TSV) wafer.
The semiconductor chip may include a flip chip.

The attaching the substrate may include using one of an adhesive layer and a glue layer to attach a glass substrate to the wafer.

The molding liquid may include an epoxy molding compound (EMC).

The prepreg may include glass fiber.

The cure in forming the mold layer may include one of a natural cure, an ultraviolet cure, a heat cure, and combinations thereof.

The mold layer may include a thickness of 80 μm to 120 μm.

The prepreg impregnated with a molding liquid may include a coefficient of thermal expansion (CTE) of 3 ppm/° C. to 5 ppm/° C.

According to example embodiments of inventive concepts, a wafer structure includes a wafer, a semiconductor chip on the wafer, and a mold layer including a glass fiber and a molding liquid. The mold layer may be on an upper and at least one lateral side of the semiconductor chip and a surface of the wafer where the semiconductor chip is not on the wafer.

According to example embodiments of inventive concepts, a wafer structure includes a wafer, a semiconductor chip on the wafer, and a mold layer including a prepreg impregnated with a molding liquid. The mold layer may be on an upper and a lateral side of the semiconductor chip and a surface of the wafer where the semiconductor chip is not on the wafer.

The molding liquid may include an epoxy molding compound (EMC).

The prepreg may include glass fiber, and the glass fiber may include one of a chopped strand, cotton yarn, a woven stuff, a knitwork, a nonwoven sheet, and combinations thereof.

The prepreg may include a glass fiber.

The mold layer may include a thickness of 80 μm to 120 μm.

The prepreg impregnated with a molding liquid may include a coefficient of thermal expansion (CTE) of 3 ppm/° C. to 5 ppm/° C.

According to example embodiments of inventive concepts, a method of making a wafer level mold includes attaching a semiconductor chip on a wafer, attaching the wafer on a temporary substrate, forming a molding layer on the semiconductor chip and the wafer, and separating the temporary substrate from the wafer.

The fiber may include a glass fiber. The forming a mold layer may include coating a molding liquid on the semiconductor chip and the wafer, adding the glass fiber to the molding liquid, and performing a compression mold and cure process on the molding liquid and the glass fiber.

The molding layer may include a coefficient of thermal expansion (CTE) between 3 ppm/° C. and 5 ppm/° C.

The fiber may include a prepreg. The forming a mold layer may include stacking the prepreg impregnated with a molding liquid on the semiconductor chip and the wafer, and performing a compression mold and cure process on the prepreg.

The molding layer may include an epoxy molding compound.

BRIEF DESCRIPTION OF THE DRAWINGS

The foregoing and other features of example embodiments of inventive concepts will be more apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Example embodiments of inventive concepts will be described in more detail with references to the accompanying drawings, in which some example embodiments are shown. Example embodiments may, however, be embodied in various forms and should not be construed as being limited to the embodiments set forth herein; rather these example embodiments of the inventive concepts are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary teen "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
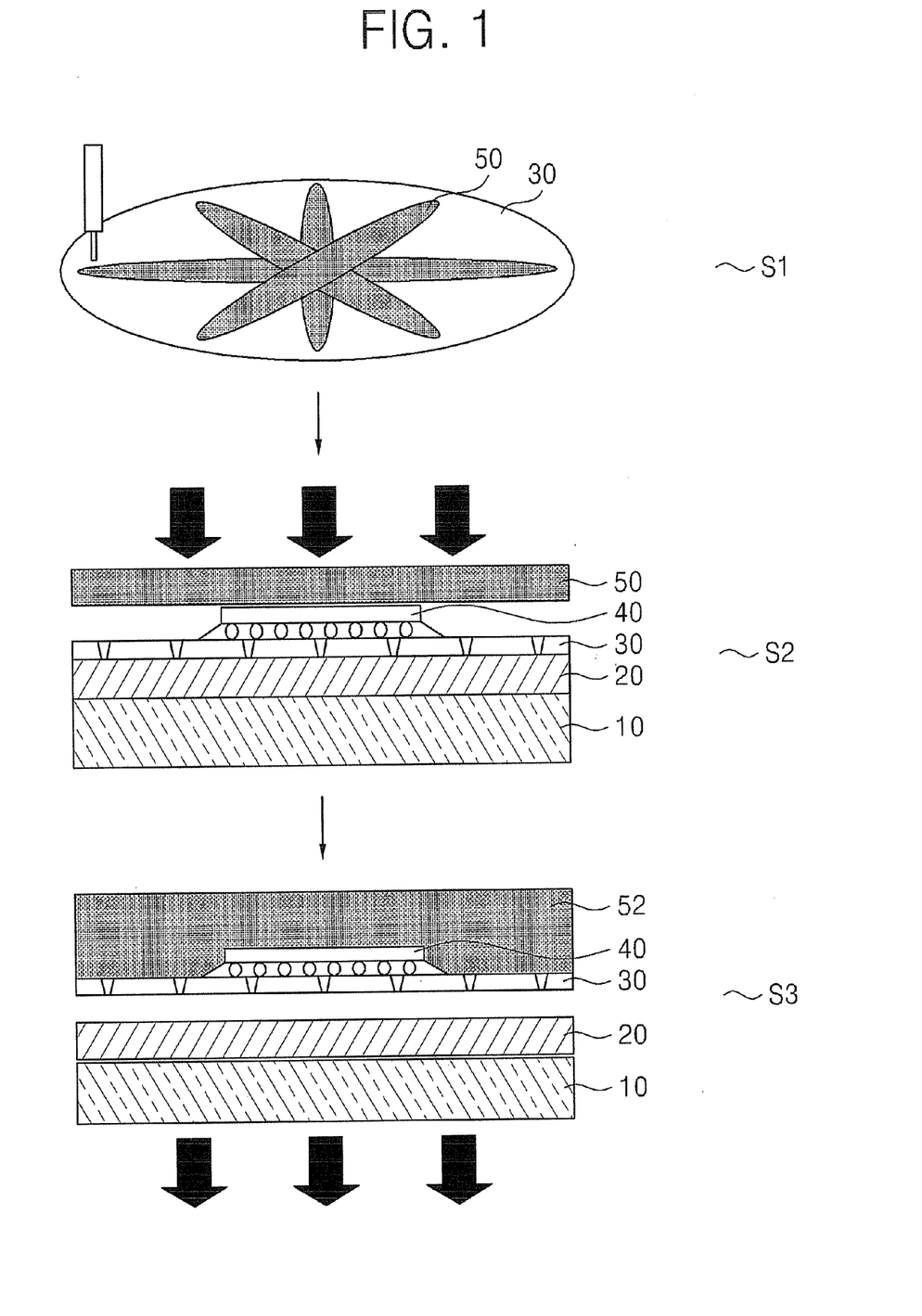
FIG. 1 is a process view sequentially illustrating a conventional method of forming a wafer level mold.
Figure 2:
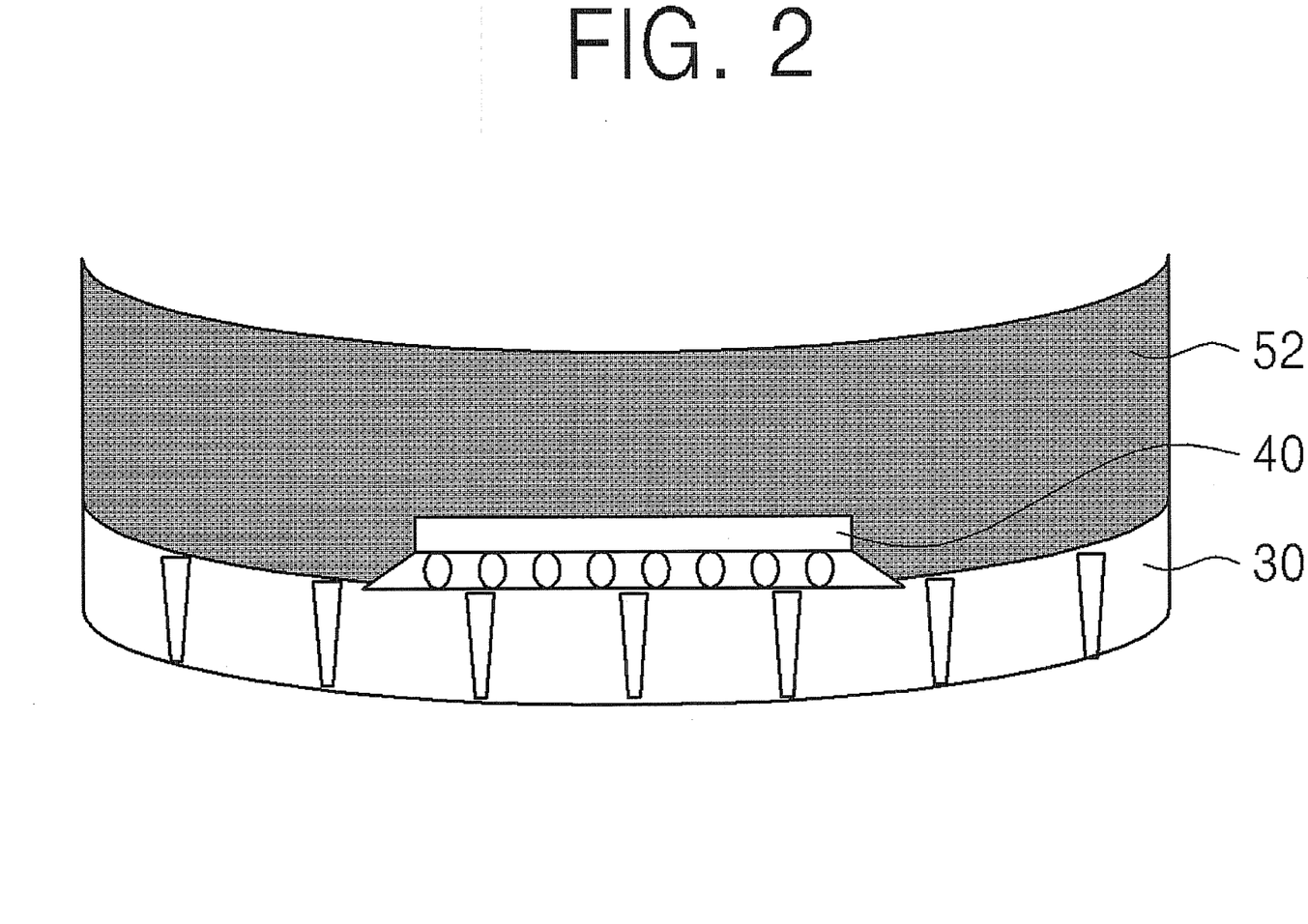
FIG. 2 is a lateral view illustrating a wafer structure based on the method of FIG. 1.

FIG. 1 is a process view sequentially illustrating a conventional method of forming a wafer level mold, and FIG. 2 is a lateral view illustrating a wafer structure based on the method of FIG. 1.

Referring to FIG. 1, the conventional method of forming the wafer level mold includes a first step S1 of applying liquid 50 to a through-silicon via (TSV) wafer 30.

In a wafer structure before a mold, a glass substrate 10, an adhesive layer 20, the TSV wafer 30 and a flip chip 40 are sequentially stacked from below.

The liquid 50 is applied to the flip chip 40 and a wafer where the flip chip 40 is not fused.

A second step S2 is to mold and cure the applied liquid 50. Thus, the liquid 50 is solidified to form a mold layer 52.

A third step S3 is to separate the glass substrate 10 from the TSV wafer 30 after forming the mold layer 52.

At this time, the adhesive layer 20 is removed.

The foregoing process completes the wafer level mold.

Referring to FIG. 2, the wafer structure 30 from which the glass substrate 10 is separated shows warpage. For example, the edge of the wafer 30 is warped upward. This warpage may be caused as the liquid 50 contracts while being cured to form the mold layer 52. Here, the CTE refers to a rate of length increased per unit length (1 m) when temperature is increased by 1° C. from 20° C. A coefficient of thermal expansion (CTE) of the TSV wafer 30 is about 4 ppm/° C. A CTE of the liquid 50 forming the wafer mold layer 52 is 70 ppm/° C. Thus, TSV wafer 30 and the liquid 50 include different CTEs. When the liquid 50 is applied to the TSV wafer 30 and molded and cured, the wafer structure is deformed due to differences in the thermal expansion of the liquid 50 and the TSV wafer 30.

The wafer 30 formed with the warped mold layer 52 may not mount easily to the PCB because the warpage may cause separation. Further, warpage may cause cracks in a chip or a Temperature Cycling (TC). Further, the mold layer foamed according to the conventional method is relatively thick in order to have sufficient strength after curing the liquid.

Figure 3:
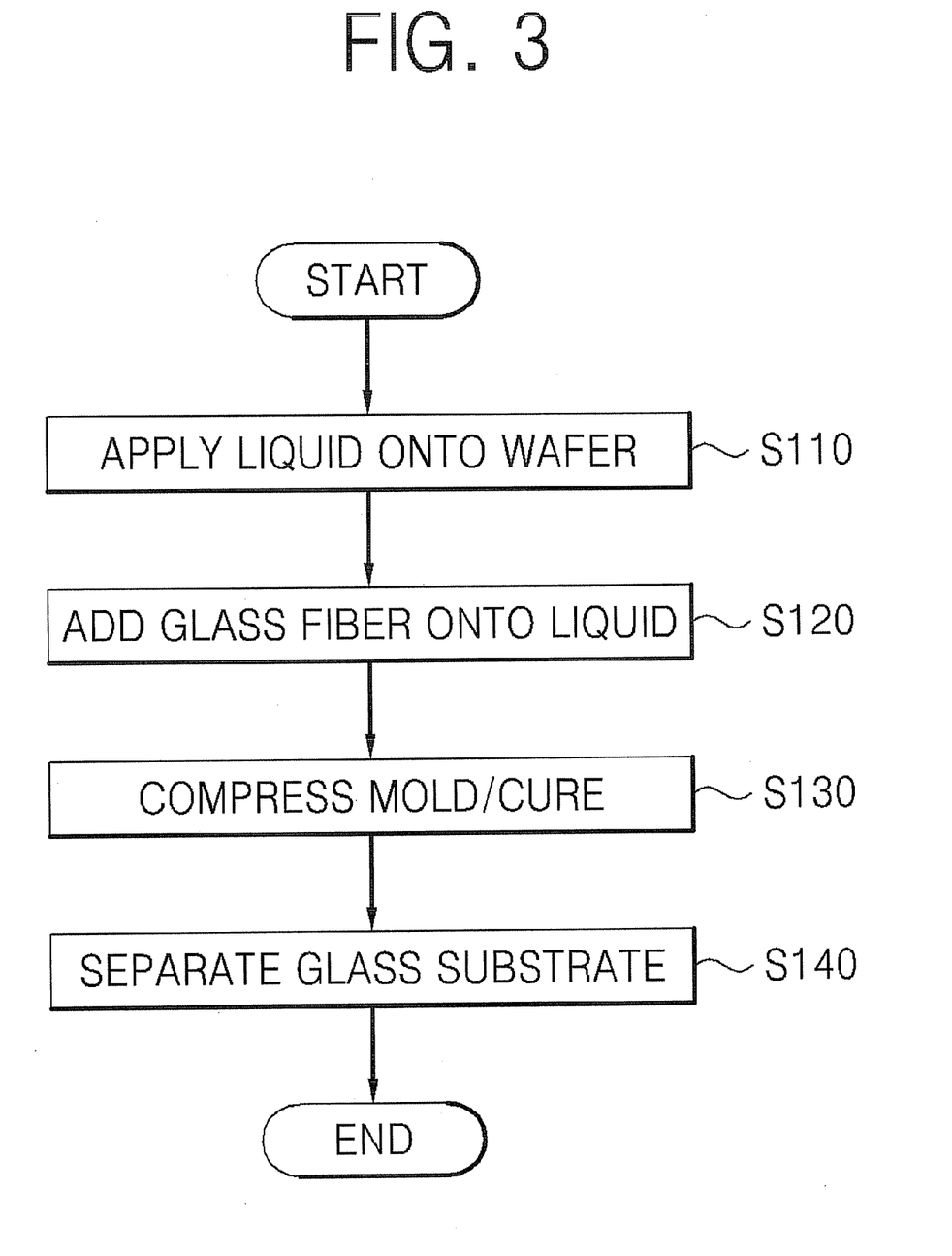
FIG. 3 is a flowchart of sequentially showing a method of forming a wafer level mold according to example embodiments of the inventive concepts.
Figure 4:
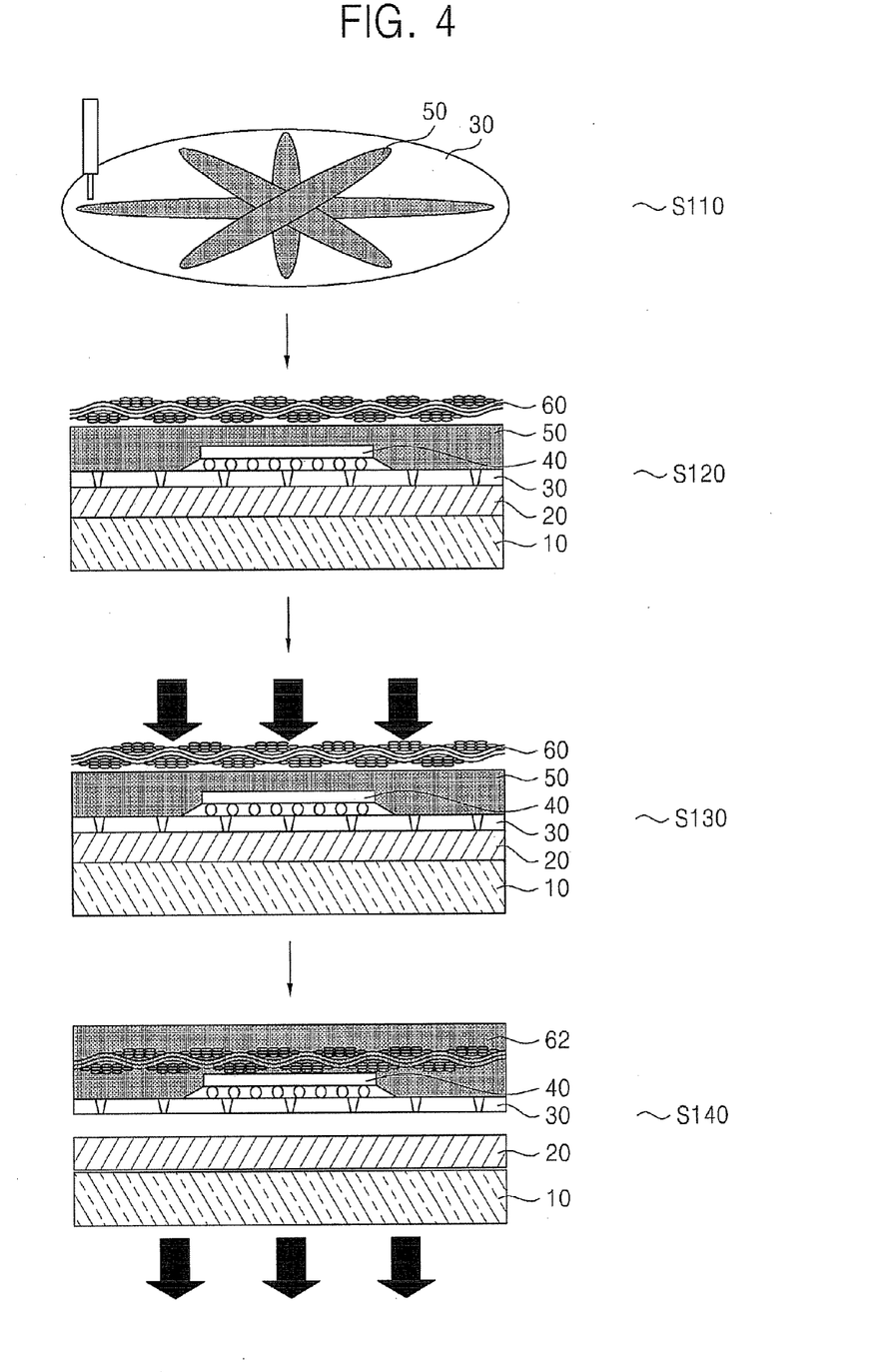
FIG. 4 is a process view based on FIG. 3.

FIG. 3 is a flowchart of sequentially showing a method of forming a wafer level mold according to example embodiments of the inventive concepts, and FIG. 4 is a process view based on FIG. 3.

Referring to FIGS. 3 and 4, a method of forming a wafer level mold according to example embodiments will be described.

In a wafer structure before a mold, a glass substrate 10, an adhesive layer 20, a through-silicon via (TSV) wafer 30 and a flip chip 40 are sequentially stacked. While FIG. 4 illustrates wafer structure including a TSV wafer 30 and a flip chip 40, example embodiments are not limited thereto. For example, example embodiments of inventive concepts can be applied to other types of wafers (and/or substrates) and/or other types of semiconductor chips.

The glass substrate 10 serves to prevent the TSV wafer 30 put thereon from being deformed by pressure due to the mold. Also, the adhesive layer 20 fixes the TSV wafer 30 on the glass substrate 10. The flip chip 40 may be fused onto the TSV wafer 30 by an electrode pattern on the lower surface thereof.

A first step, S110, includes applying liquid 50 to the TSV wafer 30.

The liquid 50 may be applied on an upper portion of the flip chip 40 and on a surface of the TSV wafer 30 where the flip chip 40 is not deposited.

The TSV wafer 30 may be a package type where a silicon wafer is penetrated to form an electrode instead of forming the electrodes by wire bonding. The TSV wafer 30 may process a high speed input/output signal and increase the number of signal channels, compared to a silicon wafer where the electrodes are formed by wire bonding.

Also, the flip chip 40 may be a semiconductor chip including an electrode pattern directly fused on the lower surface of the chip without using additional connection structures, such as metal lead or an intermediate medium such as a ball grid array (BGA), when attached to a circuit board.

The liquid 50 for forming a first mold layer 62 may include a liquefied synthetic resin, such as a thermosetting epoxy molding compound (EMC) to be used as a material for a wafer mold.

However, example embodiments of the inventive concepts are not limited thereto, and other thermosetting resin and/or thermoplastic resins may be used alternatively.

A second step, S120, includes adding a glass fiber 60 to the applied liquid 50.

The glass fiber 60 may be randomly scattered (or uniformly added) on the liquid 50 in the form of chopped strands of fiber and/or cotton yarn, or added in the form of a sheet for organizing a woven stuff, a knitwork, etc. or a nonwoven sheet, and combinations thereof, but example embodiments are not limited thereto. While FIGS. 3-4 illustrate a glass fiber 60, example embodiments are not limited thereto. Other fiber materials, for example a non-glass fibrous material, may function sufficiently and may be added to the liquid 50 according to some example embodiments.

At this time, the first mold layer 62 formed by the glass fiber 60 may have a thickness of 80 μm to 120 μm. The glass fiber 60 may be uniformly added (or randomly added). The glass fiber 60 may have a thickness that is less than a thickness of the first mold layer 62.

A third step, S130, is to compression-mold and cure the liquid 50 applied at the first step S110 and the glass fiber 60 added at the second step S120.

The compression mold refers to a mold based on compression, and the liquid may closely penetrate an inner space of the glass fiber 60 when being compressed. At this time, the applied compression is enough not to make a pore on the TSV wafer 30 or the flip chip 40, or inside the first mold layer 62.

Also, the cure may include one of a natural cure, an ultraviolet cure, a heat cure, and combinations thereof.

A fourth step, S140, includes separating the glass substrate 10 from the TSV wafer 30.

The glass substrate 10 is attached to the TSV wafer 30 with the adhesive layer 20 between, and serves to not only support the TSV wafer 30 while the liquid 50 and the glass fiber 60 are loaded on the TSV wafer 30 and molded, but also reduce contraction and expansion of the TSV wafer 30 while being processed.

At the same time when the glass substrate 10 is separated, the adhesive layer 20 is also removed. Thus, the adhesive layer 20 may be a removable adhesive. Here, the removable adhesive has relatively low adhesive strength, and limits (and/ or substantially limits) a residual damage on an adhesive surface or wafer surface when removed. Thus, a bottom surface of the TSV wafer 30 is free and/or substantially free of damage when the glass substrate 10 is separated. However, the scope of example embodiments of inventive concepts is not limited thereto, and alternatively various adhesives or glue may be used as necessary.

Figure 5:
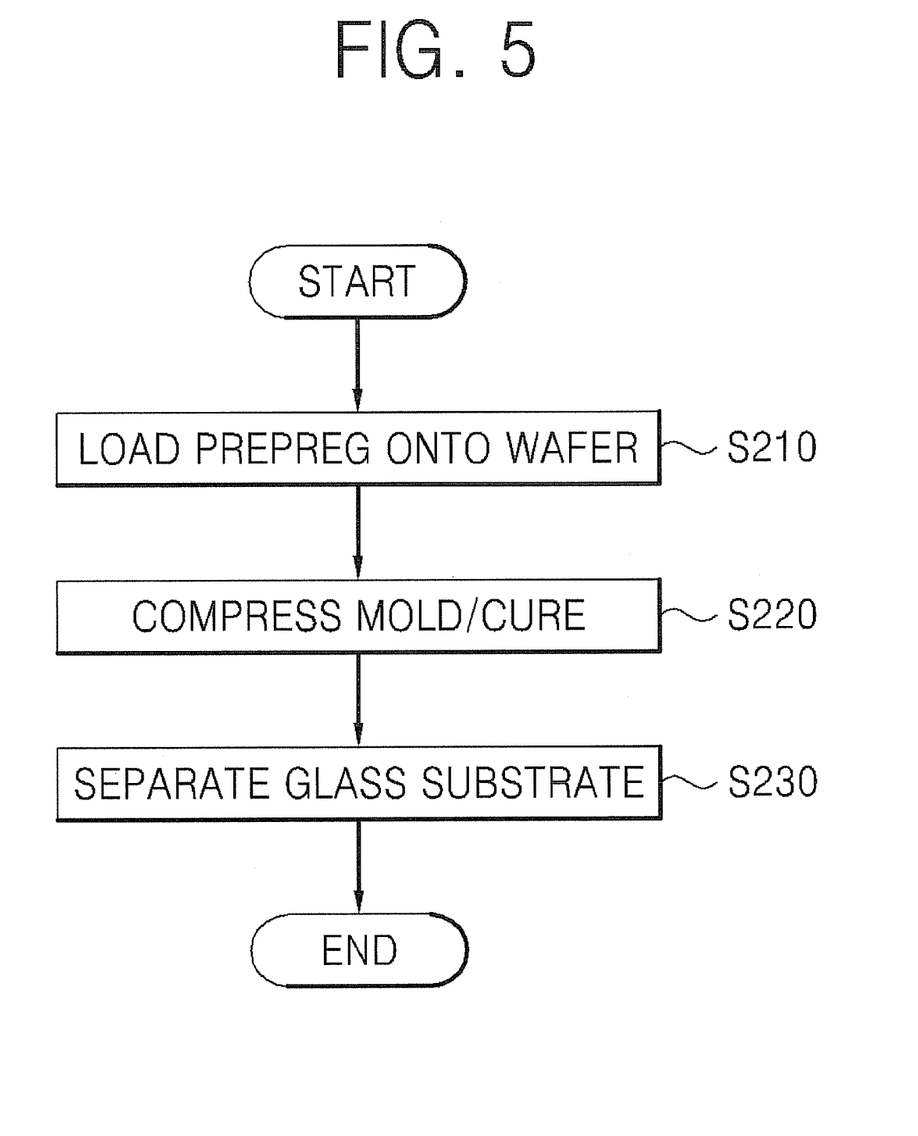
FIG. 5 a flowchart of sequentially showing a method of forming a wafer level mold according to a example embodiments inventive concepts.
Figure 6:
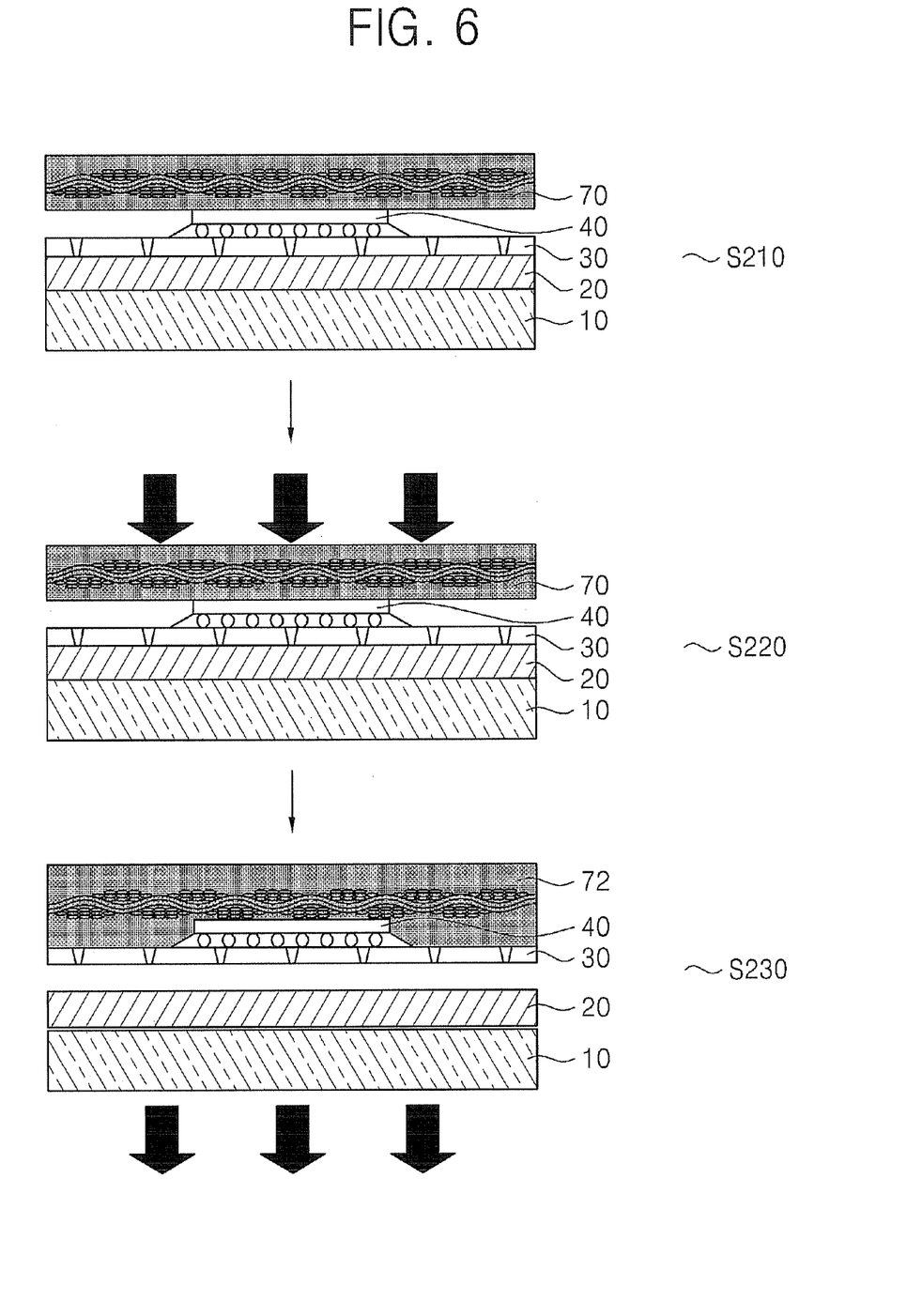
FIG. 6 is a process view based on FIG. 5.

FIG. 5 a flowchart of sequentially showing a method of forming a wafer level mold according to example embodiments of the inventive concepts, and FIG. 6 is a process view based on FIG. 5.

Referring to FIGS. 5 and 6, a method of forming a wafer level mold according to example embodiments will be described. As illustrated in FIG. 6, a second mold layer 72 may be formed by a prepreg (pre-impregnated material) 70 without separately applying the liquid 50. At this time, the wafer structure before a mold in FIG. 6 is the same as the wafer structure before a mold, as shown in FIG. 4. Thus, repetitive descriptions of the same elements are omitted.

A first step S210 includes loading the prepreg 70 on a TSV wafer 30. While FIG. 6 illustrates a TSV wafer 30 and a flip chip 40 in the wafer structure, example embodiments are not limited thereto. For example, example embodiments of inventive concepts can be applied to other types of wafers and/or other types of semiconductor chips.

The thickness of the second mold layer 72, formed by the prepreg 70, may range from 80 μm to 120 μm. The thickness of the prepreg 70 may fall within the above range after being molded and cured.

The prepreg 70 includes a sheet-type product of reinforced fiber that is previously impregnated with a coupling material, which is an intermediate material of a composite material. Here, the reinforced fiber may include carbon fiber, glass fiber, aramid fiber, etc., but example embodiments are not limited thereto. The coupling material may include a thermosetting or a thermoplastic resin such as epoxy resin, polyester resin, etc., but example embodiments are not limited thereto. Also, various characteristics may be shown in accordance with the kind of reinforced fiber, arrangement of fiber, the kind of coupling material.

Materials using the prepreg 70 may have improved strength, stiffness, corrosion resistance, fatigue, wear resistance, impact resistance, weight reduction, etc. In example embodiments, the prepreg 70 serves to improve thermal contraction.

Here, the prepreg 70 may be formed by impregnating the glass fiber with the liquid 50 before forming the second mold layer 72. Accordingly, the process of separately applying the liquid may be omitted.

Further, the density of the glass fiber may be more uniform by using the sheet previously impregnated with the liquid rather than randomly scattering the glass fiber, so that the second mold layer 72 can have uniform thermal contraction throughout.

A second step S220 includes compression-molding and curing the prepreg 70, loaded at the first step S210, in order to form the second mold layer 72.

The prepreg 70 is compressed by compression molding so that the second mold layer 72 can be closely formed on the surfaces of the TSV wafer 30 and the flip chip 40 fused thereon.

Also, the cure may include one of a natural cure, an ultraviolet cure, a heat cure, and combinations thereof.

A third step S230 includes separating the glass substrate 10 from the TSV wafer 30.

The adhesive layer 20 between the TSV wafer 30 and the glass substrate 10 may be separated with the glass substrate 10. The function and characteristics of the glass substrate 10 and the adhesive layer 20 are the same as those described in FIGS. 3-4, and thus repetitive descriptions thereof will be omitted.

Figure 7:
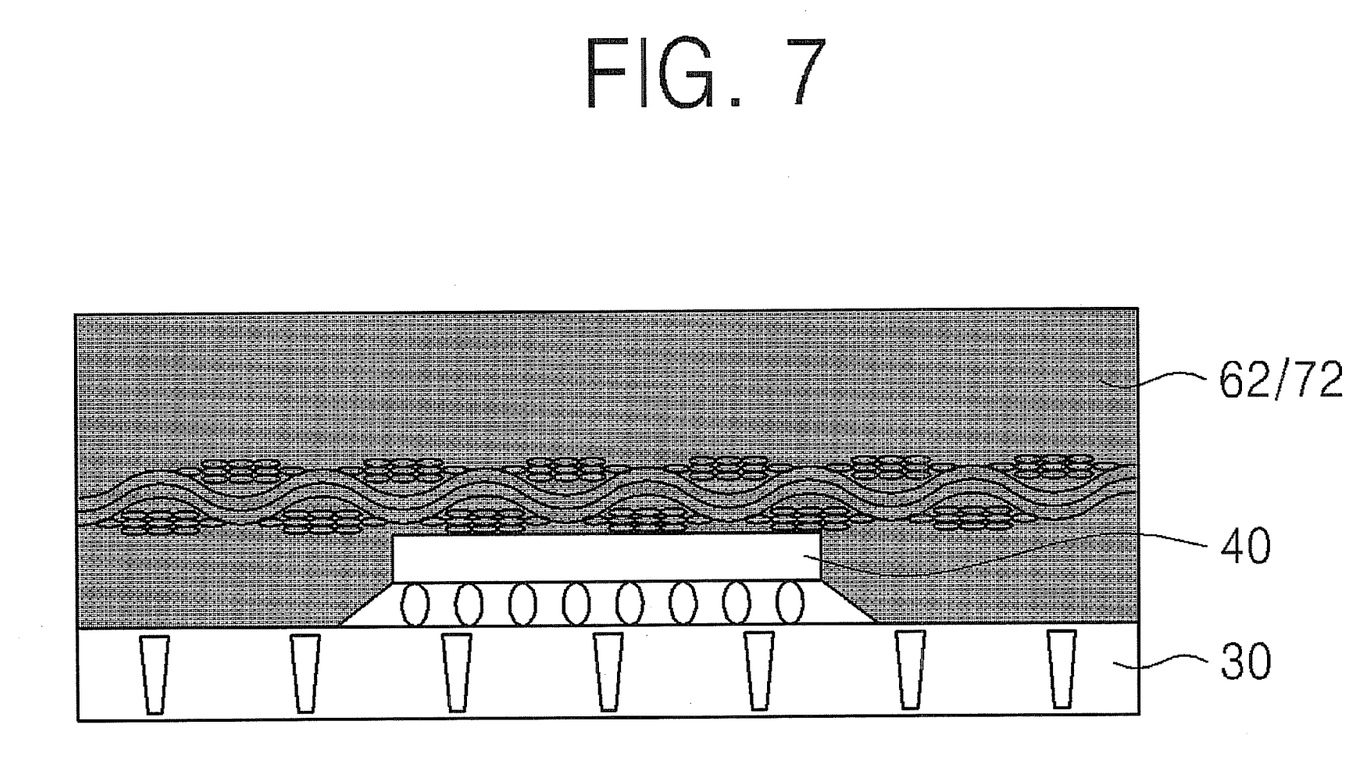
FIG. 7 is a lateral view illustrating a wafer structure according to example embodiments of the inventive concepts.

FIG. 7 is a lateral view illustrating a wafer structure according to example embodiments of the inventive concepts.

Referring to FIG. 7, a wafer structure formed by methods according to example embodiments of the inventive concepts includes the TSV wafer 30, the flip chip 40 and the mold layer 62, 72 stacked in sequence. The first mold layer 62 and the second mold layer 72 formed by methods according to example embodiments of the inventive concepts may have the same (or a similar) shapes, and thus are not distinctively illustrated.

As described above, the flip chip 40 may be partially fused on the TSV wafer 30, and the mold layer 62, 72 properly mixed and compressed with the glass fiber 60 (refer to FIG. 4) and the liquid 50 (refer to FIG. 4) may be formed on the top and lateral sides of the flip chip 40 and on the TSV wafer 30 where the flip chip 40 is not fused.

At this time, a coefficient of thermal expansion (CTE) of the TSV wafer 30 where the flip chip 40 is fused may be about 4 ppm/° C., and/or range from 3 ppm/° C. to 5 ppm/° C.

The liquid 50 contained in the mold layer 62, 72 may include a CTE of 3 ppm/° C. Thus, the difference in thermal expansion between the TSV wafer 30 and the mold layer 62, 72 is reduced. As a result, warpage from thermal expansion differences between the wafer and the liquid 50 during the cure may be reduced.

Further, as compared with the conventional mold layer containing only the epoxy molding compound (EMC), the mold layer using the added glass fiber or the prepreg impregnated with the synthetic resin has relatively high strength and therefore can be manufactured more thinly than the conventional mold layer, thereby reducing processing costs.

Specifically, the mold layer containing only the EMC includes a thickness of about 300 μm, while a thickness of about 100 μm of the mold layer 62, 72 according to the example embodiments of the inventive concepts is enough to protect a semiconductor chip.

As apparent from example embodiments of the inventive concepts, there are effects on reducing warpage of a molded wafer as difference in the CTE between the wafer and the mold layer is reduced by adding glass fiber to a liquid material to be molded or by applying compression mold to prepreg impregnated with the liquid forming the mold layer, and at the same time reducing the thickness of the mold layer with enhanced durability.

While some example embodiments of inventive concepts have been particularly shown and described, it will be understood by a person having an ordinary skill in the art that various changes in form and details may be made therein without departing from the spirit and scope of the following claims.

What is claimed is:

1. A method of forming a wafer level mold comprising:
   attaching a substrate to a lower side of a wafer on which a semiconductor chip is arranged;
   loading a prepreg impregnated with a molding liquid onto an upper side of the semiconductor chip and on an upper side of the wafer where the semiconductor chip is not arranged;
   forming a mold layer by compression-molding and curing the loaded prepreg; and
   separating the substrate from the wafer.

2. The method according to claim 1, wherein
   the wafer comprises a through-silicon via (TSV) wafer.

3. The method according to claim 1, wherein
   the semiconductor chip comprises a flip chip.

4. The method according to claim 1, wherein the attaching the substrate comprises: using one of an adhesive layer and a glue layer to attach a glass substrate to the wafer.

5. The method according to claim 1, wherein
   the molding liquid comprises an epoxy molding compound (EMC).

6. The method according to claim 1, wherein
   the prepreg comprises glass fiber.

7. The method according to claim 1, wherein the cure in forming the mold layer comprises:
   one of a natural cure, an ultraviolet cure, a heat cure, and combinations thereof.

8. The method according to claim 1, wherein
   the mold layer includes a thickness of 80 μm to 120 μm.

9. The method according to claim 1, wherein the prepreg impregnated with a molding liquid includes a coefficient of thermal expansion (CTE) of 3 ppm/° C. to 5 ppm/° C.

10. The method of claim 1, wherein
    the attaching the substrate comprises using one of an adhesive layer and a glue layer to attach the substrate directly to the wafer, and
    the method further includes separating the one of the adhesive layer and the glue layer from the wafer during the separating the substrate from the wafer.

11. A method of making a wafer level mold comprising:
    attaching a semiconductor chip on a wafer;
    attaching the wafer on a temporary substrate;
    forming a molding layer on the semiconductor chip and the wafer,
    the molding layer including a fiber; and
    separating the temporary substrate from the wafer.

12. The method of claim 11, wherein
    the fiber is a glass fiber, and
    the forming a molding layer comprises:
       coating a molding liquid on the semiconductor chip and the wafer,
       adding the glass fiber to the molding liquid, and
       performing a compression mold and cure process on the molding liquid and glass fiber.

13. The method of claim 12, wherein
    the molding liquid and the glass fiber form a mixture including a coefficient of thermal expansion (CTE) between 3 ppm/° C. and 5 ppm/° C.

14. The method of claim 11, wherein
    the fiber is a prepreg, and
    the forming a molding layer comprises:
       stacking the prepreg impregnated with a molding liquid on the semiconductor chip and the wafer; and performing a compression mold and cure process on the prepreg.

15. The method of claim 11, wherein the molding layer includes an epoxy molding compound.

16. The method of claim 11, wherein the attaching the wafer on the temporary substrate comprises using one of an adhesive layer and a glue layer to attach the temporary substrate directly to the wafer, and the method further includes separating the one of the adhesive layer and the glue layer from the wafer during the separating the temporary substrate from the wafer.

17. The method of claim 11, wherein the wafer comprises a through-silicon via (TSV) wafer.

* * * * *